United States Patent
Luo

(10) Patent No.: US 11,935,797 B2
(45) Date of Patent: Mar. 19, 2024

(54) TEST METHOD, ADJUSTMENT METHOD, TEST SYSTEM, AND STORAGE MEDIUM FOR ALIGNMENT ERROR

(71) Applicant: CHANGXIN MEMORY TECHNOLOGIES, INC., Hefei (CN)

(72) Inventor: Xiaodong Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 17/452,570

(22) Filed: Oct. 27, 2021

(65) Prior Publication Data

US 2022/0310460 A1    Sep. 29, 2022

Related U.S. Application Data

(63) Continuation of application No. PCT/CN2021/111778, filed on Aug. 10, 2021.

(30) Foreign Application Priority Data

Mar. 29, 2021    (CN) .......................... 202110336244.7

(51) Int. Cl.
*G01R 31/26*      (2020.01)
*H01L 21/66*      (2006.01)

(52) U.S. Cl.
CPC .......... *H01L 22/12* (2013.01); *G01R 31/2601* (2013.01)

(58) Field of Classification Search
CPC ............... G01R 31/26; G01R 31/2601; G01R 31/2831; H01L 21/66; H01L 22/12;
(Continued)

(56) References Cited

U.S. PATENT DOCUMENTS 6,393,714 B1      5/2002  Look et al.
6,693,834 B1 *   2/2004  Wu ....................... G11C 29/025
                                                              365/201
(Continued)

FOREIGN PATENT DOCUMENTS

CN      102437067 A      5/2012
CN      203787419 U      8/2014
(Continued)

OTHER PUBLICATIONS

English translation of CN 108089412A (Year: 2018).*
(Continued)

*Primary Examiner* — Jermele M Hollington
*Assistant Examiner* — Courtney G McDonnough
(74) *Attorney, Agent, or Firm* — Syncoda LLC; Feng Ma

(57) ABSTRACT

A test method for an alignment error includes: providing a substrate, wherein a first conductive layer and a second conductive layer are arranged on the substrate at intervals, and the first conductive layer and the second conductive layer are arranged in a first direction; acquiring a first distance; acquiring a first resistance of the first conductive layer and a second resistance of the second conductive layer; acquiring an actual distance between the first conductive layer and the second conductive layer according to the first distance, the first resistance, and the second resistance; and acquiring a value of the alignment error between the first (Continued)

conductive layer and the second conductive layer based on the actual distance and a standard distance between the first conductive layer and the second conductive layer.

15 Claims, 4 Drawing Sheets

(58) Field of Classification Search
CPC ......... H01L 22/14; H01L 22/20; H01L 22/32; H01L 22/34; H01L 2223/54426; H01L 23/544; H01L 21/68721; H01L 21/68735; H01L 21/78; H01L 22/30; H01L 2223/5442; H01L 2223/54453; H01L 25/0753; H01L 25/167; H01L 27/1259; H01L 2924/00; H01L 2924/0002; H01L 2933/0066; H01L 31/1832; H01L 33/005; H01L 33/0095; H01L 33/62; G01B 15/00; G01B 21/00; G01B 21/30; H10B 41/30; H10B 41/10; H10B 43/20; H10B 10/00; H10B 12/00; H10B 20/00; H10B 41/00; H10B 43/00; H10B 51/00; H10B 53/00; H10B 61/00; H10B 63/00; H10B 69/00; H10B 80/00; H10B 99/00
USPC .................................................... 324/762.05
See application file for complete search history.

(56) References Cited

U.S. PATENT DOCUMENTS

| | | | |
|---|---|---|---|
| 2005/0195398 A1* | 9/2005 | Adel | B82Y 10/00 356/401 |
| 2015/0140695 A1* | 5/2015 | Bauch | H01L 22/12 438/14 |
| 2021/0209401 A1* | 7/2021 | Zhang | G06V 30/1988 |

FOREIGN PATENT DOCUMENTS

| | | | | |
|---|---|---|---|---|
| CN | 206076226 U | | 4/2017 | |
| CN | 108089412 A | * | 5/2018 | ........... G03F 9/7003 |
| CN | 211404455 U | | 9/2020 | |
| CN | 112320754 A | | 2/2021 | |
| CN | 113093482 A | | 7/2021 | |
| KR | 19990065763 A | | 8/1999 | |
| KR | 20090098278 A | | 9/2009 | |

OTHER PUBLICATIONS

CN first office action in Application No. 202110336244.7, dated Feb. 11, 2022.
International Search Report in Application No. PCT/CN2021/111778, dated Jan. 5, 2022.

* cited by examiner

TEST METHOD, ADJUSTMENT METHOD, TEST SYSTEM, AND STORAGE MEDIUM FOR ALIGNMENT ERROR

CROSS-REFERENCE TO RELATED APPLICATIONS

This is a continuation of International Patent Application No.: PCT/CN2021/111778 filed on Aug. 10, 2021, which claims priority to Chinese Patent Application No. 202110336244.7 filed on Mar. 29, 2021. The above-referenced applications are incorporated herein by reference in their entirety.

BACKGROUND

Yellow-light process is a commonly used process in the field of semiconductors. Yellow-light process is also known as photolithography, and the principle thereof is as follows. Photosensitive substance coated on glass surface is subjected to exposure and developing to form a patterned photoresist layer that can protect the underlying semiconductor structure. After photoetching, the semiconductor structure is etched by using the patterned photoresist layer as a photomask, so as to obtain a permanent pattern. Before exposure, an alignment operation may also be performed depending on alignment marks on the cutting path, so that the semiconductor structure can be aligned with the photomask, and the pattern on the photomask can be accurately transferred to the photosensitivity substance.

SUMMARY

The embodiments of the present application relate to the technical field of semiconductors, and specifically to a test method, an adjustment method, a test system, and a storage medium for an alignment error.

Embodiments of the present application provide a test method, an adjustment method, a test system, and a storage medium for an alignment error.

An embodiment of the present application provides a test method for an alignment error, including: providing a substrate, wherein a first conductive layer and a second conductive layer are arranged on the substrate at intervals, and the first conductive layer and the second conductive layer are arranged in a first direction; acquiring a first distance, wherein the first distance is a distance between a central axis of the first conductive layer in a direction perpendicular to the first direction and a central axis of the second conductive layer in a direction perpendicular to the first direction; acquiring a first resistance of the first conductive layer and a second resistance of the second conductive layer; acquiring an actual distance between the first conductive layer and the second conductive layer according to the first distance, the first resistance, and the second resistance; and acquiring a value of the alignment error between the first conductive layer and the second conductive layer based on the actual distance and a standard distance between the first conductive layer and the second conductive layer.

An embodiment of the present application further provides a test system for an alignment error, which is suitable for implementing the test method for the alignment error described above. The system includes a first acquisition module, a second acquisition module, a third acquisition module, and a calculation module. The first acquisition module is applied to acquire the first distance. The second acquisition module is applied to acquire the first resistance and the second resistance. The third acquisition module is applied to acquire the actual distance between the first conductive layer and the second conductive layer through the first distance, the first resistance, and the second resistance. The calculation module is applied to acquire a value of the alignment error between the first conductive layer and the second conductive layer through the actual distance and a standard distance between the first conductive layer and the second conductive layer.

An embodiment of the present application further provides an adjustment method for an alignment error, including: adjusting process parameters of a yellow-light process according to the value of the alignment error obtained by the above test method for the alignment error, so as to change the actual distance between the first conductive layer and the second conductive layer on a subsequent batch of substrates.

An embodiment of the present application further provides a computer-readable storage medium for storing a computer program. Specifically, the computer program, when being executed by a processor, implements any one of the above test methods for the alignment error.

BRIEF DESCRIPTION OF THE DRAWINGS

One or more embodiments are exemplarily illustrated by the pictures depicted in the corresponding drawings. These exemplary illustrations do not constitute any limit to the embodiments, and unless otherwise specified, the pictures depicted in the drawings can be at any scale in addition to those shown in the drawings.

DETAILED DESCRIPTION

In A production process, low-yield semiconductor structures often appear. After slicing and physical failure analysis, it is found that alignment error will affect the accuracy of the pattern and ultimately affect the performance of the semiconductor structure.

Various embodiments of the present disclosure can address the problem of accurately testing an alignment error.

Figure 1:
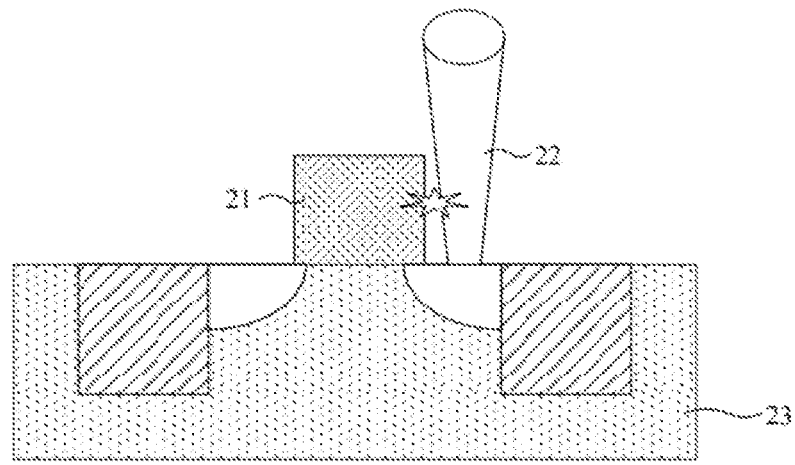
FIG. 1 is a schematic diagram of a semiconductor structure.

FIG. 1 is a schematic diagram of a semiconductor structure. As shown in FIG. 1, the semiconductor structure includes the substrate 23, and the first conductive layer 21 and the second conductive layer 22 that are arranged on the substrate 23 at intervals. When a relatively large alignment error exists, short circuit readily occurs between the first conductive layer 21 and the second conductive layer 22 if the first conductive layer 21 is arranged extremely close to the second conductive layer 22, thereby causing transistor failure.

Figure 2:
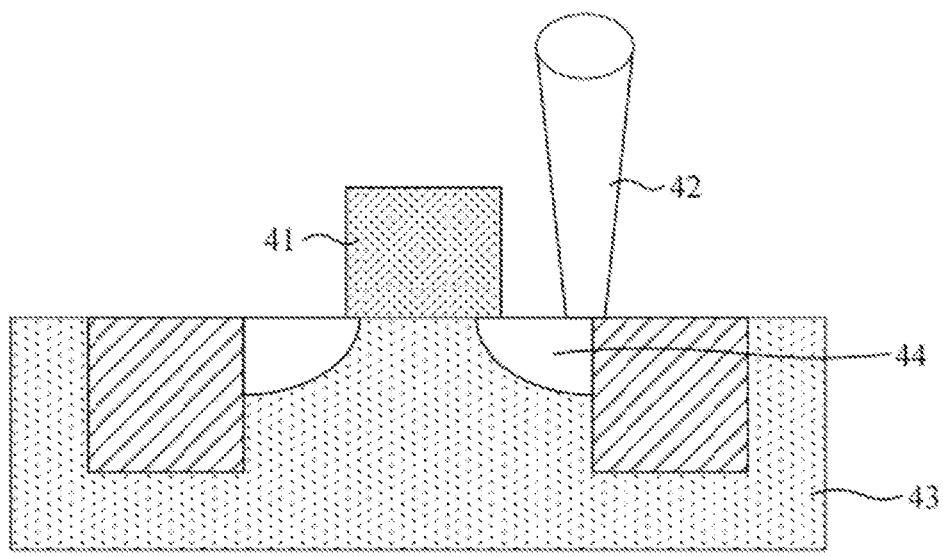
FIG. 2 is a schematic diagram of another semiconductor structure.

FIG. 2 is a schematic diagram of a semiconductor structure. As shown in FIG. 2, the semiconductor structure includes the substrate 43, the first conductive layer 41 and the second conductive layer 42 that are located on the substrate 43 at intervals, and the source/drain electrode 44 within the substrate 43. When a relatively large alignment error exists, the second conductive layer 42 may not exactly be located on the source/drain electrode 44 if the first conductive layer 41 is arranged too far away from the second conductive layer 42, which leads to a problem in voltage transmission, and thereby reduces the yield of the semiconductor structure.

After analysis, it is found that the main reason is as follows. Currently, alignment marks are generally formed on a surface, such as a cutting path, of the semiconductor structure, and the alignment error is acquired by measuring an offset value between a former alignment mark and a latter alignment mark on the surface of the semiconductor structure. Due to the facts that only a limited number of alignment marks can be set, and each alignment mark can only serve as an alignment reference within a certain range of the semiconductor structure instead of an alignment reference for specific local structures in the semiconductor structure, alignment errors of all areas of the semiconductor structure are hardly measured through measuring offset values of the limited number of alignment marks, nor can alignment errors of the specific local structures be measured. In other words, the existing means for measuring and measuring alignment marks can only be applied to detection of a limited number of areas in the semiconductor structure, and shows a low accuracy in measuring alignment errors of local structures.

An embodiment of the present application provides a test method for an alignment error, including: acquiring an actual distance between a first conductive layer and a second conductive layer by acquiring a first resistance of the first conductive layer, a second resistance of the second conductive layer, and a first distance between a central axis of the first conductive layer and a central axis of the second conductive layer, and obtaining the alignment error based on the actual distance and a standard distance. Therefore, the embodiment of the present application can be performed to test alignment errors between different conductive layers in the semiconductor structure, thus expanding a test range of the alignment error. Additionally, the embodiment of the present application can be conducted to test alignment errors of adjacent conductive layers in local structures, thereby improving a measurement accuracy of alignment errors of local structures.

In order to make the purposes, technical solutions and advantages of the embodiments of the present application clearer, the various embodiments of the present application will be described in detail below in conjunction with the accompanying drawings. However, those skilled in the art can understand that many technical details are proposed in the various embodiments of the present application for facilitating the understanding of the present application. However, even without these technical details and the diverse variations and modifications based on the embodiments, the technical solutions protected in the present application can also be implemented.

Figure 3:
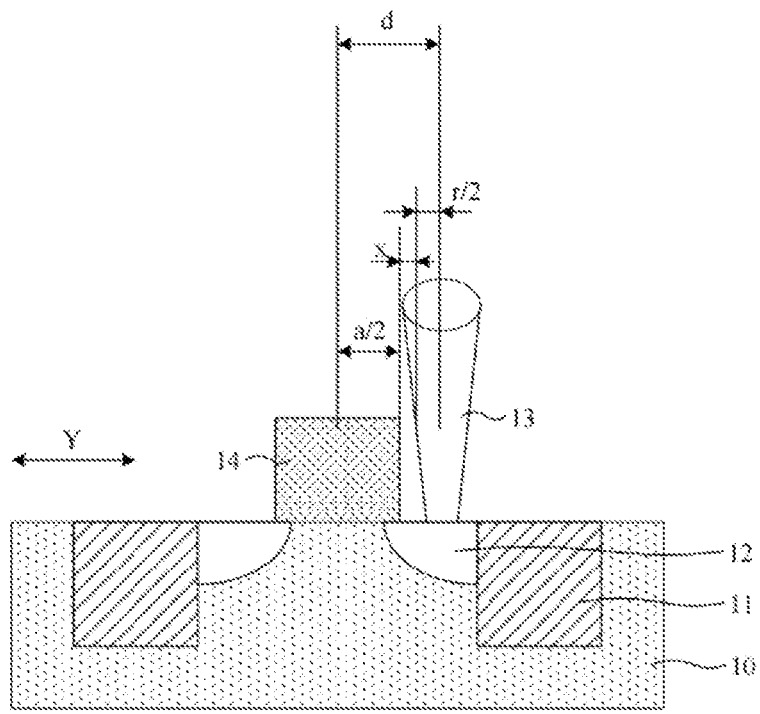
FIG. 3 is a schematic diagram of an alignment error test provided by an embodiment of the present application.
Figure 4:
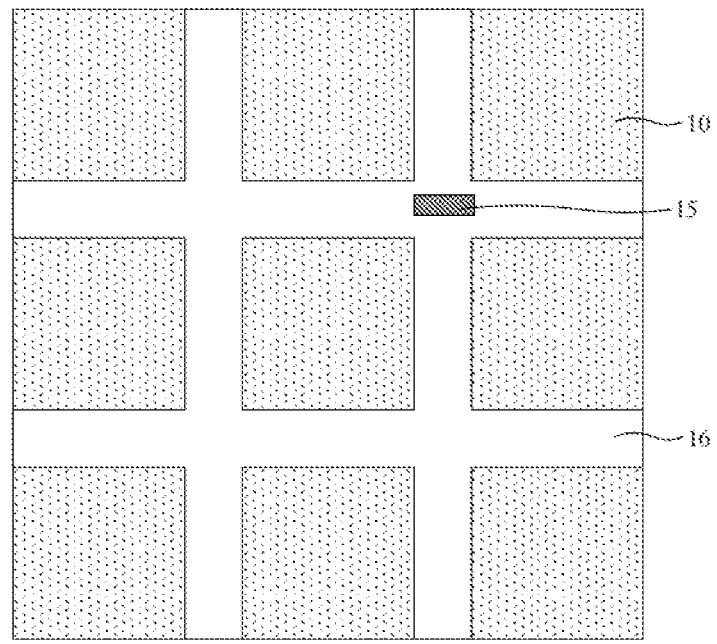
FIG. 4 is a top view of a substrate provided by an embodiment of the present application.
Figure 5:
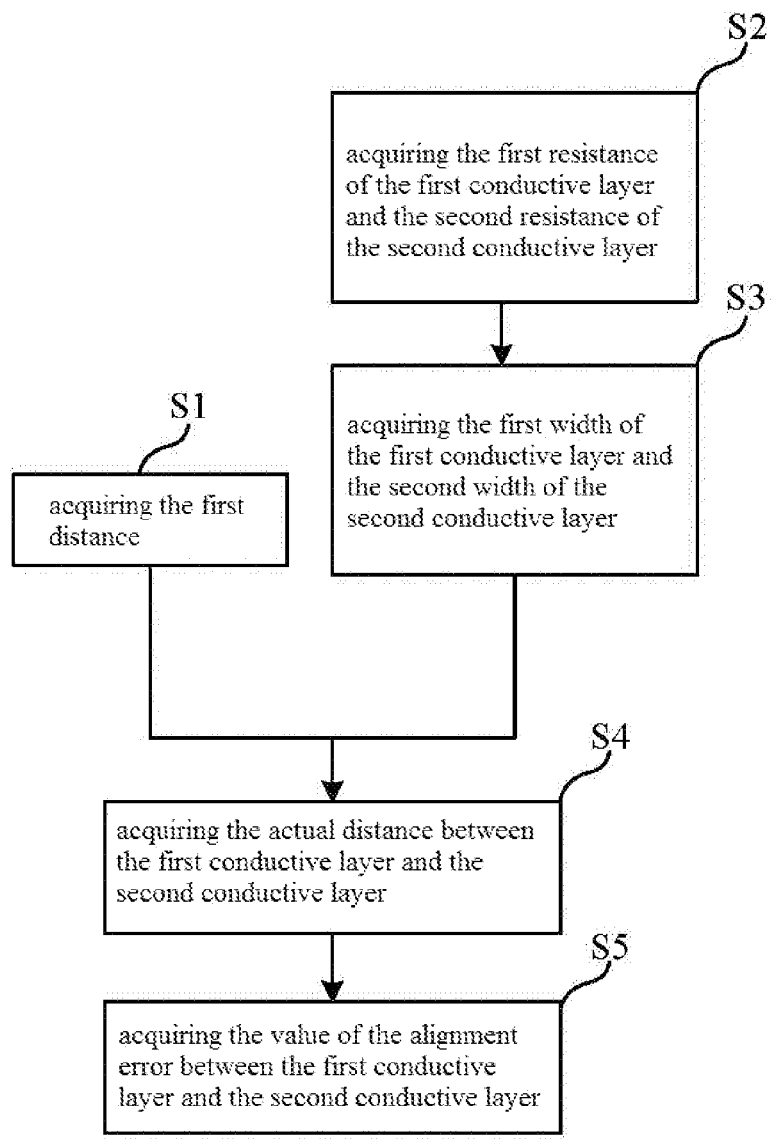
FIG. 5 is a flow chart of an alignment error test provided by an embodiment of the present application.

An embodiment of the present application provides a test method for an alignment error. FIG. 3 shows a schematic diagram of the test method for the alignment error, FIG. 4 is a top view of a substrate, and FIG. 5 is a flow chart showing an alignment error test.

Referring to FIG. 3, the substrate 10 is provided, the first conductive layer 14 and the second conductive layer 13 are arranged on the substrate 10 at intervals, and the first conductive layer 14 and the second conductive layer 13 are arranged in the first direction Y.

The substrate 10 can be made of a semiconductor material such as silicon, germanium, etc. The substrate 10 further includes the source/drain electrode 12, and the source/drain electrode 12 can be made of a semiconductor material, such as silicon, germanium, etc., that is doped with boron ions, phosphorus ions, or the like. The substrate 10 further includes the shallow trench isolation structure 11.

In some embodiments, the first conductive layer 14 is a gate structure, and the gate structure can be made of a conductive material such as polysilicon, tungsten, etc. The second conductive layer 13 is a conductive contact structure, the second conductive layer 13 is a single-layer structure, and the second conductive layer 13 can be made of a conductive material such as polysilicon, copper, silver, or the like. It is worth noting that in the present embodiment, the gate structure and the conductive contact structure are only taken as an example, which do not constitute any limitation to types of the first conductive layer 14 and the second conductive layer 13. In other embodiments, the first conductive layer and the second conductive lawyer can be any two conductive structures.

A dielectric layer is further provided between the first conductive layer 14 and the second conductive layer 13. The dielectric layer is configured for isolating the first conductive layer 14 from the second conductive layer 13, so that the first conductive layer 14 is prevented from being electrically connected to the second conductive layer 13, thereby avoiding the occurrence of electric leakage or short circuit.

It can be understood that, if an actual distance between the first conductive layer 14 and the second conductive layer 13 is relatively large, the contact surface between the second conductive layer 13 and the source/drain electrode 12 may offset, thereby reducing the contact effect between the second conductive layer 13 and the source/drain electrode 12. If an actual distance between the first conductive layer 14 and the second conductive layer 13 is relatively small, that is, the dielectric layer between the first conductive layer 14 and the second conductive layer 13 is relatively thin, there is a risk of short circuit and electric leakage occurring between the first conductive layer 14 and the second conductive layer 13, thereby causing a possibility of transistor failure. Whereas, the test method for the alignment error provided by the present embodiment can accurately measure an actual distance between the first conductive layer 14 and the second conductive layer 13, and a relatively accurate alignment error can be obtained by comparing the actual distance and a standard distance. The alignment error can be fed back to a process of manufacturing a subsequence batch of semiconductor structures, so as to adjust process parameters to reach a proper actual distance between the first conductive layer 14 and the second conductive layer 13 in the follow-up batch.

The test method is specifically illustrated below.

Referring to FIG. 3 and FIG. 5, S1: the first distance d is obtained, and the first distance d is a distance between a central axis of the first conductive layer 14 in a direction perpendicular to the first direction Y and a central axis of the second conductive layer 13 in a direction perpendicular to the first direction Y.

Compared to other axes of the first conductive layer 14 and the second conductive layer 13 in a direction perpendicular to the first direction Y, the central axes can be positioned with a higher accuracy and a lower difficulty.

In some embodiments, the first distance d can be acquired through a scanning electron microscope. For example, the semiconductor structure is pre-processed first, formulated into a size fitting into a sample holder of the instrument, and performed with a surface cleaning. The semiconductor structure is placed in the instrument, followed by selecting an appropriate magnification, adjusting a part to be tested of the semiconductor structure to the center of the field of view, and shooting under optimal conditions. A scale division close to a length to be tested is selected and moved to the center of the field of view, the scale division is arranged in a direction parallel to a direction to be tested, and then shooting is conducted again after focusing. The first distance d is acquired based on the magnification, the scale division, and the distance between two central axes in the captured image.

S2: a first resistance of the first conductive layer 14 and a second resistance of the second conductive layer 13 are acquired. For example, a certain voltage is applied to the first conductive layer 14, and the current flowing through the first conductive layer 14 is measured under the voltage. The first resistance of the first conductive layer 14 is acquired based on the voltage and the current. A certain voltage is applied to the second conductive layer 13, and the current flowing through the second conductive layer 13 is measured under the voltage. The second resistance of the second conductive layer 13 is acquired based on the voltage and the current.

S3: the first width a of the first conductive layer 14 and the second width r of the second conductive layer 13 are acquired. For example, the first width a of the first conductive layer 14 in the first direction Y is acquired through the first resistance, and the second width r of the second conductive layer 13 in the first direction Y is acquired through the second resistance.

The resistance of a conductive structure is associated with the size of the conductive structure. For example, the larger the resistance of the conductive structure is, the smaller the size of the conductive structure is; the smaller the resistance of the conductive structure is, the larger the size of the conductive structure is. As such, the first width a of the first conductive layer 14 and the second width r of the second conductive layer 13 can be acquired after acquiring the first resistance and the second resistance.

Specifically, a method for acquiring the first width a is as follows. Since the first resistance and the first width a have a first correspondence, the first width can be calculated through the first resistance and the first correspondence. It can be understood that the first resistance is related to the height of the first conductive layer 14 in the direction perpendicular to the first direction Y, the cross-section area of the first conductive layer 14 in the first direction Y, and the resistivity of the material. For example, the first resistance can be expressed by the following formula: $R_1=\rho_1L_1/S_1$, where, $R_1$ is the first resistance, $\rho_1$ is the resistivity of the first conductive layer 14, $L_1$ is the height of the first conductive layer 14 in the direction perpendicular to the first direction Y, and $S_1$ is the cross-section area of the first conductive layer 14 in the first direction Y.

For example, a cross section of the first conductive layer 14 is square or circular. When the cross section of the first conductive layer 14 is square, $R_1=\rho_1L_1/a^2$; when the cross section of the first conductive layer 14 is circular, $R_1=4\rho_1L_1/(\pi a^2)$. In this regard, the first width a can be obtained through $R_1$, $\rho_1$, and $L_1$. In addition, $L_1$ can be acquired by a scanning electron microscope, and $\rho_1$ needs to be determined according to the specific material of the first conductive layer 14.

It can be understood that, in other embodiments, if the first width of the first conductive layer in the first direction is relatively large, the first width can also be measured accurately by the scanning electron microscope.

Specifically, a method for acquiring the second width r is as follows. Since the second resistance and the second width r have a second correspondence, the second width r can be calculated through the second resistance and the second correspondence. It can be understood that the second resistance is related to the height of the second conductive layer 13 in the direction perpendicular to the first direction Y, the cross-section area of the second conductive layer 13 in the first direction Y, and the resistivity of the material. For example, the second resistance can be expressed by the following formula: $R_2=\rho_2L_2/S_2$, where, $R_2$ is the second resistance, $\rho_1$ is the resistivity of the second conductive layer 13, $L_2$ is the height of the second conductive layer 13 in the direction perpendicular to the first direction Y, and $S_2$ is the cross-section area of the second conductive layer 13 in the first direction Y.

In the actual process, the sidewall of the second conductive layer 13 may have a certain slope, so that the area of the top of the second conductive layer 13 is larger than the area of the bottom of the second conductive layer 13. Therefore, the cross-section area $S_2$ calculated by using the above formula is not the area of the top or bottom of the second conductive layer 13, instead, the cross-section area $S_2$ is the cross-section area of the middle area of the second conductive layer 13 in the direction perpendicular to the first direction Y. Compared to the top or the bottom, the distance between the cross section of the middle area of the second conductive layer 13 and the first conductive layer 14 can reflect the actual distance there between more accurately.

For example, a cross section of the second conductive layer 13 is square or circular. When the cross section of the second conductive layer 13 is square, $R_2=\rho_2L_2/r^2$; when the cross section of the second conductive layer 13 is circular, $R_2=4\rho_2L_2/(\pi r^2)$. In this regard, the second width r can be obtained through $R_2$, $\rho_2$, and $L_2$. It can be understood that the second width r obtained is not the width of the top or bottom of the second conductive layer 13, instead, the second width r is the width of the cross section of the middle area of the second conductive layer 13.

S4: the actual distance x between the first conductive layer 14 and the second conductive layer 13 is acquired. For example, the actual distance x is acquired through the first distance d, the first width a, and the second width r. The actual distance x, the first distance d, the first width a, and the second width r satisfy: $x=d-\frac{1}{2}(a+r)$. In FIG. 3, a/2 represents ½ of the first width a, r/2 represents ½ of the second width r.

It is worth noting that, if the width of the second conductive layer 13 is tested from the above of the semiconductor structure using the scanning electron microscope, the resulting width may be relatively large; if the distance between the second conductive layer 13 and the first conductive layer 14 is acquired directly using the scanning electron microscope, the resulting distance may be relatively small. Whereas in the present embodiment, the distance between cross sections of the middle areas of the first conductive layer 14 and the second conductive layer 13 is acquired through the width of the cross section of the middle area of the second conductive layer 13, as a result, a relatively accurate actual distance can be obtained.

S5: a value of the alignment error between the first conductive layer 14 and the second conductive layer 13 is acquired. For example, the value of the alignment error between the first conductive layer 14 and the second conductive layer 13 is acquired through the actual distance x and a standard distance between the first conductive layer 14 and the second conductive layer 13. For example, the value of the alignment error is equal to the difference obtained by the actual distance x subtracting the standard distance.

In some embodiments, referring to FIG. 4 which shows a top view of the substrate, the alignment mark 15 is provided on the cutting path 16 of the substrate 10; before acquiring the value of the alignment error between the first conductive layer 14 and the second conductive layer 13, the step of acquiring offset values of the alignment mark 15 in different processes is further included.

For example, the positional deviation of the alignment mark 15 on the substrate 10 during the process of manufacturing the first conductive layer 14 and the process of manufacturing the second conductive layer 13 is measured by the scanning electron microscope to obtain the offset value of the alignment mark 15, thus the offset value between the first conductive layer 14 and the second conductive layer 13 in the semiconductor structure can be obtained.

It is worth noting that, the alignment mark 15 is used as an alignment reference for a certain area or some structures of the semiconductor structure. In some embodiments, the alignment mark 15 serves as an alignment reference for a transistor, and the transistor includes the first conductive layer 14 and the second conductive layer 13. Since the alignment remark 15 and the transistor have a correspondence, the alignment mark 15 and the first conductive layer 14 and the second conductive layer 13 also have correspondence.

After obtaining the offset value of the alignment mark 15, the first conductive layer 14 and the second conductive layer 13 corresponding to the alignment mark 15 are determined based on the alignment mark 15. The offset value between the first conductive layer 14 and the second conductive layer 13 measured through the alignment mark 15 and the alignment error between the first conductive layer 14 and the second conductive layer 13 measured by the method of the present embodiment are references for each other, so as to improve the test accuracy. In addition, a certain area of the semiconductor structure is positioned by the alignment mark 15, and then the first conductive layer 14 and the second conductive layer 13 are positioned through the positioned area, which can improve the test efficiency.

In summary, in the present embodiment, the actual distance between the first conductive layer and the second conductive layer can be acquired by acquiring the first resistance, the second resistance, and the first distance, and the alignment error can be obtained based on the actual distance and the standard distance. As such, the present embodiment can expand the test range of the alignment error; and can further enhance the measurement accuracy of alignment errors of local areas and local structures.

Figure 6:
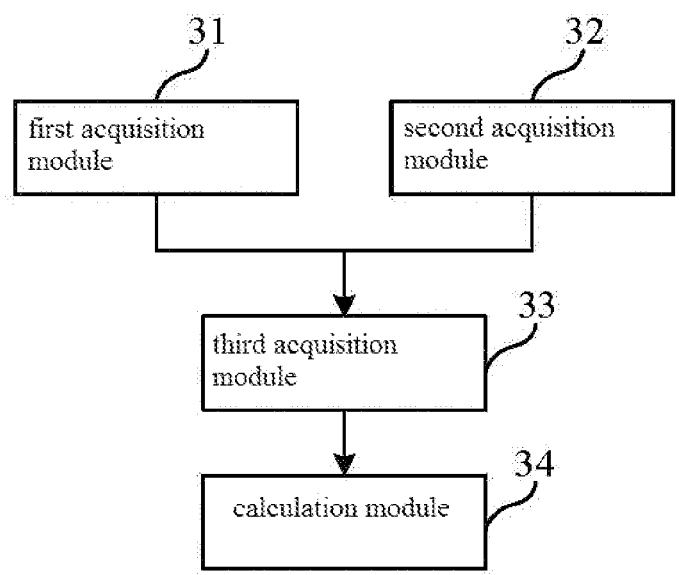
FIG. 6 is a functional block diagram of a test system for an alignment error provided by an embodiment of the present application.

Another embodiment of the present application provides a test system for an alignment error, which is suitable for implementing the test method for the alignment error as described in the above embodiment. FIG. 6 shows a functional block diagram of the test system for the alignment error provided by the present embodiment. Referring to FIG. 6, the system includes the first acquisition module 31, the second acquisition module 32, the third acquisition module 33, and the calculation module 34.

Specifically, the first acquisition module 31 is applied to acquire the first distance. The first distance is the distance between the central axis of the first conductive layer in the direction perpendicular to the first direction and the central axis of the second conductive layer in the direction perpendicular to the first direction. The first acquisition module 31 includes a scanning electron microscope through which the first distance can be acquired.

The second acquisition module 32 is applied to acquire the first resistance and the second resistance. The second acquisition module 32 includes an ammeter and a voltmeter. The first resistance and the second resistance are acquired through a current value obtained by the ammeter and a voltage value obtained by the voltmeter.

The third acquisition module 33 is applied to acquire the actual distance between the first conductive layer and the second conductive layer through the first distance, the first resistance, and the second resistance. For example, the third acquisition module 33 acquires the first width of the first conductive layer according to the first resistance, acquires the second width of the second conductive layer according to the second resistance, and acquires the actual distance according to the first width, the second width, and the first distance.

The calculation module 34 is applied to acquire a value of the alignment error between the first conductive layer and the second conductive layer through the actual distance and the standard distance between the first conductive layer and the second conductive layer. For example, the calculation module 34 acquires the value of the alignment error by the actual distance subtracting the standard distance.

Another embodiment of the present application provides an adjustment method for an alignment error as follows.

Process parameters of a yellow-light process are adjusted according to the value of the alignment error obtained by the above test method for the alignment error, so as to change the actual distance between the first conductive layer and the second conductive layer on a subsequent batch of substrates.

In other words, the value of the alignment error between the first conductive layer and the second conductive layer in the former batch can be used to optimize the subsequent production process, thereby reducing the alignment error between the first conductive layer and the second conductive layer, and improving the yield of the subsequent semiconductor structures.

Various embodiments of the present application can have one or more of the following advantages.

In the embodiments of the present application, the first distance is acquired, and the first distance is the distance between a central axis of the first conductive layer and a central axis of the second conductive layer. The first resistance of the first conductive layer and the second resistance of the second conductive layer are acquired. The actual distance between the first conductive layer and the second conductive layer can be acquired through the first resistance, the second resistance, and the first distance, and the alignment error can be obtained according to the actual distance and the standard distance. Therefore, the embodiments of the present application can test alignment errors of different conductive layers in the semiconductor structure, thereby expanding the test range of the alignment error, and improving the measurement accuracy of the alignment error.

Another embodiment of the present application provides a computer-readable storage medium for storing a computer program. The computer program, when being executed by a processor, implements the test method for the alignment error described in the above embodiment.

It can be understood that all or parts of the steps in the methods of the above-mentioned embodiments can be implemented by instructing related hardware via a program. The program is stored in a storage medium, including a plurality of instructions configured for enabling a device or processor to execute each step in the test method. The above-mentioned storage medium includes: USB flash drive, mobile hard disk, read-only memory (ROM), random access memory (RAM), magnetic disk, optical disk, or various media that can store program codes.

Those having ordinary skills in the art can understand that the various embodiments described above are specific embodiments for implementing the present application. However, in practice use, various modifications can be made to the embodiments in terms of forms and details without departing from the spirit and scope of the present application. A skilled person in the art can perform variations and modifications without departing from the spirit and scope of the present application. As such, the protection scope of the present application should be defined by the appended claims.

What is claimed is:

1. A test method for an alignment error, comprising:
providing a substrate, wherein a first conductive layer and a second conductive layer are arranged on the substrate and spaced apart from each other at a predetermined interval in a first direction, and the first direction is parallel to a plane where the substrate is located;
acquiring a first distance, wherein the first distance is a distance between a central axis of the first conductive layer in a direction perpendicular to the first direction and a central axis of the second conductive layer in a direction perpendicular to the first direction;
acquiring a first resistance of the first conductive layer and a second resistance of the second conductive layer;
acquiring an actual distance between the first conductive layer and the second conductive layer according to the first distance, the first resistance, and the second resistance; and
acquiring a value of the alignment error between the first conductive layer and the second conductive layer based on the actual distance and a standard distance between the first conductive layer and the second conductive layer.

2. The test method for the alignment error according to claim 1, wherein after acquiring the first resistance and the second resistance, the method further comprises: acquiring a first width of the first conductive layer in the first direction according to the first resistance; and acquiring a second width of the second conductive layer in the first direction according to the second resistance.

3. The test method for the alignment error according to claim 2, wherein a method for acquiring the actual distance between the first conductive layer and the second conductive layer comprises: acquiring the actual distance according to the first distance, the first width, and the second width, and the actual distance, the first distance, the first width, and the second width satisfy:
x=d−½(a+r), wherein x is the actual distance, a is the first width, r is the second width, and d is the first distance.

4. The test method for the alignment error according to claim 2, wherein a method for acquiring the first width comprises: the first resistance and the first width having a first correspondence, and acquiring the first width according to the first resistance and the first correspondence.

5. The test method for the alignment error according to claim 4, wherein the first conductive layer is a gate structure.

6. The test method for the alignment error according to claim 2, wherein a method for acquiring the second width comprises: the second resistance and the second width having a second correspondence, and acquiring the second width according to the second resistance and the second correspondence.

7. The test method for the alignment error according to claim 6, wherein the second conductive layer is a conductive contact structure.

8. The test method for the alignment error according to claim 6, wherein a cross section of the second conductive layer in the first direction is circular, and the second correspondence is $R_2=4\rho_2 L_2/(\pi r^2)$, wherein $R_2$ is the second resistance, $\rho_2$ is a resistivity of the second conductive layer, $L_2$ is a height of the second conductive layer in the direction perpendicular to the first direction, and r is the second width.

9. The test method for the alignment error according to claim 6, wherein a cross section of the second conductive layer in the first direction is square, and the second correspondence is $R_2=\rho_2 L_2/r^2$, wherein $R_2$ is the second resistance, $\rho_2$ is a resistivity of the second conductive layer, $L_2$ is a height of the second conductive layer in the direction perpendicular to the first direction, and r is the second width.

10. The test method for the alignment error according to claim 1, wherein the first distance is acquired by a scanning electron microscope.

11. The test method for the alignment error according to claim 1, wherein the substrate is provided with an alignment mark; and before acquiring the value of the alignment error between the first conductive layer and the second conductive layer, the method further comprises:
acquiring an offset value of the alignment mark in different processes.

12. The test method for the alignment error according to claim 11, wherein the alignment mark has a correspondence to the first conductive layer and the second conductive layer, and the first conductive layer and the second conductive layer corresponding to the alignment mark are determined according to the alignment mark.

13. A test device for an alignment error, wherein the test device for the alignment error is suitable for implementing the test method for the alignment error according to claim 1, and the device comprises a processor and a storage medium for storing instructions executable by the processor, wherein the processor is configured to:
acquire the first distance;
acquire the first resistance and the second resistance;
acquire the actual distance between the first conductive layer and the second conductive layer through the first distance, the first resistance, and the second resistance; and
acquire a value of the alignment error between the first conductive layer and the second conductive layer through the actual distance and a standard distance between the first conductive layer and the second conductive layer.

14. An adjustment method for an alignment error, comprising:
adjusting process parameters of a yellow-light process according to the value of the alignment error obtained by the test method for the alignment error according to claim 1, so as to change the actual distance between the first conductive layer and the second conductive layer on a subsequent batch of substrates.

15. A non-transitory computer-readable storage medium, configured for storing a computer program, wherein the computer program, when being executed by a processor, implements the test method for the alignment error according to claim 1.

* * * * *